US009530866B1

(12) United States Patent
Zhang et al.

(10) Patent No.: US 9,530,866 B1
(45) Date of Patent: Dec. 27, 2016

(54) METHODS OF FORMING VERTICAL TRANSISTOR DEVICES WITH SELF-ALIGNED TOP SOURCE/DRAIN CONDUCTIVE CONTACTS

(71) Applicant: GLOBALFOUNDRIES Inc., Grand Cayman (KY)

(72) Inventors: John H. Zhang, Altamont, NY (US); Carl Radens, LaGrangeville, NY (US); Steven J. Bentley, Menards, NY (US); Brian A. Cohen, Delmar, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/097,621

(22) Filed: Apr. 13, 2016

(51) Int. Cl.
    *H01L 21/02* (2006.01)
    *H01L 21/265* (2006.01)
    *H01L 21/3105* (2006.01)
    *H01L 29/66* (2006.01)

(52) U.S. Cl.
    CPC ..... *H01L 29/66666* (2013.01); *H01L 21/0217* (2013.01); *H01L 21/02126* (2013.01); *H01L 21/26513* (2013.01); *H01L 21/31051* (2013.01); *H01L 29/6653* (2013.01); *H01L 29/6656* (2013.01); *H01L 29/66545* (2013.01)

(58) Field of Classification Search
    None
    See application file for complete search history.

(56) References Cited

U.S. PATENT DOCUMENTS

| 5,342,797 | A | 8/1994 | Sapp et al. |
|---|---|---|---|
| 5,414,289 | A | 5/1995 | Fitch et al. |
| 6,372,559 | B1 | 4/2002 | Crowder et al. |
| 6,686,604 | B2 | 2/2004 | Layman et al. |
| 6,690,040 | B2 | 2/2004 | Chaudhry et al. |
| 6,759,730 | B2 | 7/2004 | Chaudhry et al. |
| 7,241,655 | B2 | 7/2007 | Tang et al. |
| 7,465,622 | B2 | 12/2008 | Lin |
| 7,666,733 | B2 | 2/2010 | Delconibus |

(Continued)

OTHER PUBLICATIONS

Hergenrother et al., "The Vertical Replacement-Gate (VRG) MOSFET: A 50-nm Vertical MOSFET with Lithography-Independent Gate Length," IEDM 99-75-78, IEEE 1999.

(Continued)

*Primary Examiner* — Asok K Sarkar
(74) *Attorney, Agent, or Firm* — Amerson Law Firm, PLLC

(57) ABSTRACT

Forming a first sidewall spacer adjacent a vertically oriented channel semiconductor structure ("VCS structure') and adjacent a cap layer, performing at least one planarization process so as to planarize an insulating material and expose an upper surface of the cap layer and an upper surface of the first spacer and removing a portion of the first spacer and an entirety of the cap layer so as to thereby expose an upper surface of the VCS structure and define a spacer/contact cavity above the VCS structure and the first spacer. The method also includes forming a second spacer in the spacer/contact cavity, forming a top source/drain region in the VCS structure and forming a top source/drain contact within the spacer/contact cavity that is conductively coupled to the top source/drain region, wherein the conductive contact physically contacts the second spacer in the spacer/contact cavity.

16 Claims, 15 Drawing Sheets

(56) References Cited

U.S. PATENT DOCUMENTS

| | | |
|---|---|---|
| 7,700,432 B2 | 4/2010 | Chaudhry et al. |
| 8,637,849 B2 | 1/2014 | Deligianni et al. |
| 9,224,840 B2 | 12/2015 | Flachowsky et al. |
| 9,385,195 B1 | 7/2016 | Zhang |
| 2003/0047749 A1 | 3/2003 | Chaudhry et al. |
| 2003/0119237 A1* | 6/2003 | Chittipeddi ..... H01L 21/823885 438/199 |
| 2007/0111414 A1 | 5/2007 | Chaudhry et al. |
| 2011/0253981 A1* | 10/2011 | Rooyackers ........... B82Y 10/00 257/24 |
| 2013/0341270 A1 | 12/2013 | Kar et al. |
| 2016/0005850 A1* | 1/2016 | Zhao .................... H01L 29/781 257/329 |

OTHER PUBLICATIONS

Notice of Allowance from related U.S. Appl. No. 15/097,574 dated Sep. 14, 2016.

\* cited by examiner

METHODS OF FORMING VERTICAL TRANSISTOR DEVICES WITH SELF-ALIGNED TOP SOURCE/DRAIN CONDUCTIVE CONTACTS

BACKGROUND OF THE INVENTION

1. Field of the Invention

Generally, the present disclosure relates to the manufacture of semiconductor devices, and, more specifically, to various novel methods of forming vertical transistor devices with self-aligned top source/drain conductive contacts.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a simplistic depiction of an illustrative prior art vertical transistor device 10. In general, the vertical transistor 10 comprises a generally vertically oriented channel semiconductor structure 12A that extends upward from a front surface 12S of a semiconductor substrate 12. The semiconductor structure 12A may have a variety of different configurations when viewed from above, e.g., circular, rectangular, square, etc. The device 10 further comprise a channel region 13, a gate-all-around (GAA) gate structure 14, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

FIGS. 1B-1F simplistically depict one illustrative prior art process flow that is employed to form replacement gate structures on vertical transistor devices. FIG. 1B depicts the device 10 after several process operations were performed. First, a plurality of the above-described vertically oriented channel semiconductor structures 12A are formed above the substrate 12. Thereafter, several layers of material were sequentially deposited above the substrate: a layer of spacer material for the bottom spacer 15B, a sacrificial layer of material 21 (e.g., silicon dioxide) and a layer of spacer material for the top spacer 15T. Also depicted in FIG. 1B is a patterned etch mask layer 23. The patterned etch mask 23 may be made of a variety of different materials, e.g., photoresist, a combination of layers, etc.

FIG. 1C depicts the device 10 after an etching process was performed through the patterned etch mask 23 to remove the exposed portions of the top spacer layer 15T. The etching process stops on the sacrificial layer 21. FIG. 1C depicts the device after the patterned etch mask 23 was removed.

FIG. 1D depicts the device after a wet etching process was performed to remove the sacrificial layer 21 relative to the surrounding materials so as to define a plurality of replacement gate cavities 25.

FIG. 1E depicts the device 10 after simplistically depicted materials 14 for the replacement gate structure were formed so as to overfill the replacement gate cavities 25. The materials 14 for the replacement gate structure would normally include a high-k gate insulation layer (not separately shown), one or more additional metal-containing layers (e.g., work function adjusting metal layers), such as titanium nitride, and a bulk conductive fill material, such as tungsten or polysilicon. The high-k insulation layer and the additional metal-containing layers are typically formed by performing a conformal deposition process.

FIG. 1F depicts the device 10 after several process operations were performed. First, a chemical mechanical planarization (CMP) process was performed to planarize the upper surface of the gate materials 14 with the upper surface 15S of the patterned top spacer layer 15T. Thereafter, one or more anisotropic etching processes were performed to remove exposed portions of the gate materials 14, wherein the etching process ultimately stops on the layer of bottom spacer material 15B. As depicted, these operations result in the formation of separate GAA gate structures 14 that wrap around the channel portion 13 of the devices. Importantly, using this prior art process flow, the gate structures 14 are not self-aligned in that the lateral width 14L of the gate structure 14 is approximately defined by the lateral width 15L of the patterned features of the top spacer layer 15T. Since these features are defined by a patterning process, e.g., masking and etching, the control of the exact size and exact positioning of these patterned features is subject to the problems generally encountered when defining features using patterning processes such as, for example, positional accuracy relative to other structures (like the structures 12A), pattern transfer variations, etc. These types of issues are only expected to be more problematic as device dimensions continue to decrease with advancing technology.

The present disclosure is directed to methods of forming vertical transistor devices with self-aligned top source/drain conductive contacts that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming vertical transistor devices with a self-aligned top source/drain conductive contact. One illustrative method disclosed herein includes, among other things, forming a vertically oriented channel semiconductor structure with a cap layer positioned thereabove, forming a first sidewall spacer adjacent the vertically oriented channel semiconductor structure and adjacent the cap layer, forming a layer of insulating material adjacent the first sidewall spacer, and performing at least one planarization process so as to planarize an upper surface of the layer of insulating material and expose an upper surface of the cap layer and an upper surface of the first sidewall spacer. In this example, the method also includes performing at least one etching process to remove a portion of the first sidewall spacer and to remove an entirety of the cap layer so as to thereby expose an upper surface of the vertically oriented channel semiconductor structure and define a spacer/contact cavity above the vertically oriented channel semiconductor structure and the first sidewall spacer, forming a second spacer in the spacer/contact cavity, wherein, after formation of the second spacer, at least a portion of the upper surface of the vertically oriented channel semiconductor structure remains exposed, after forming the second spacer, forming a top source/drain region in the vertically oriented channel semiconductor structure and forming a top source/drain contact within the spacer/contact cavity that is conductively coupled to the top source/drain region, wherein the conductive contact physically contacts the second spacer in the spacer/contact cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
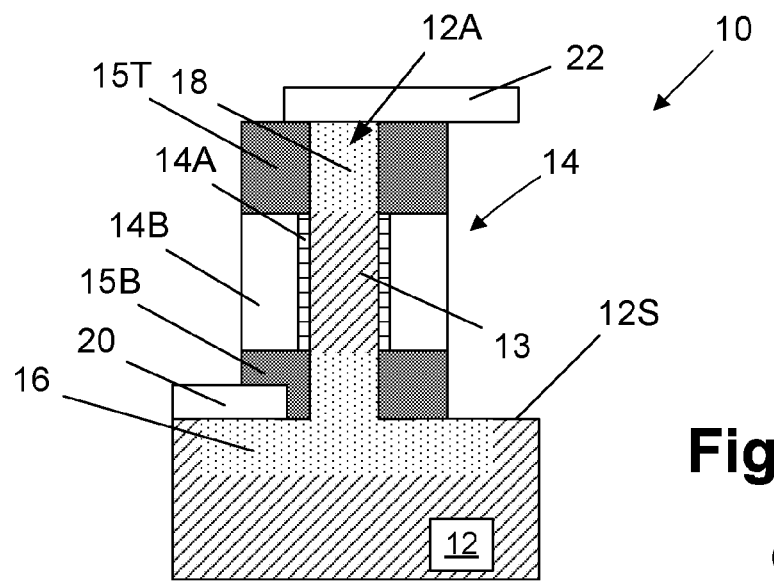
FIGS. 1A-1F simplistically depict an illustrative prior art vertical transistor device and a prior art method of forming a replacement gate structure on such a device.
Figure 1B:
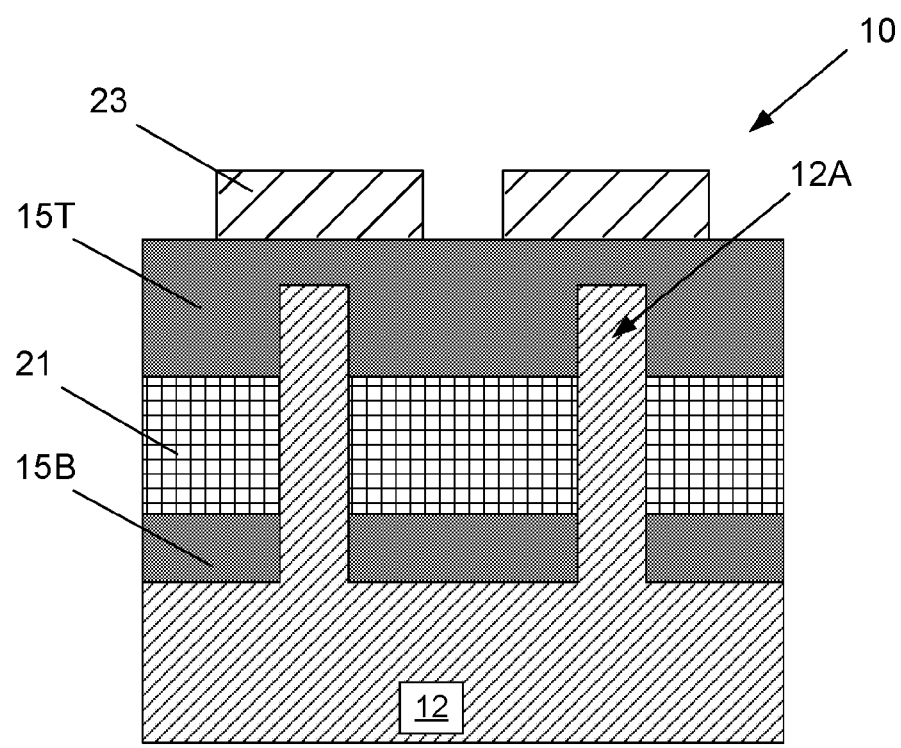
Figure 1C:
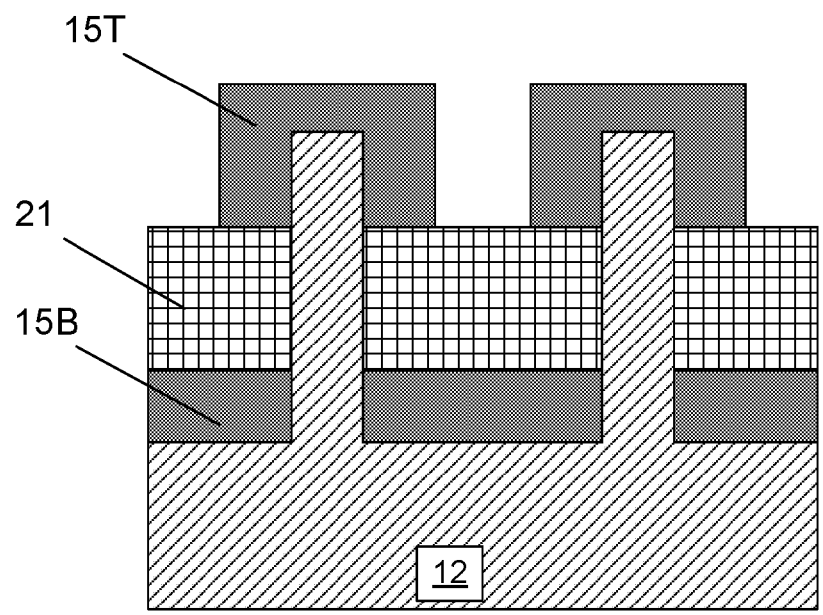
Figure 1D:
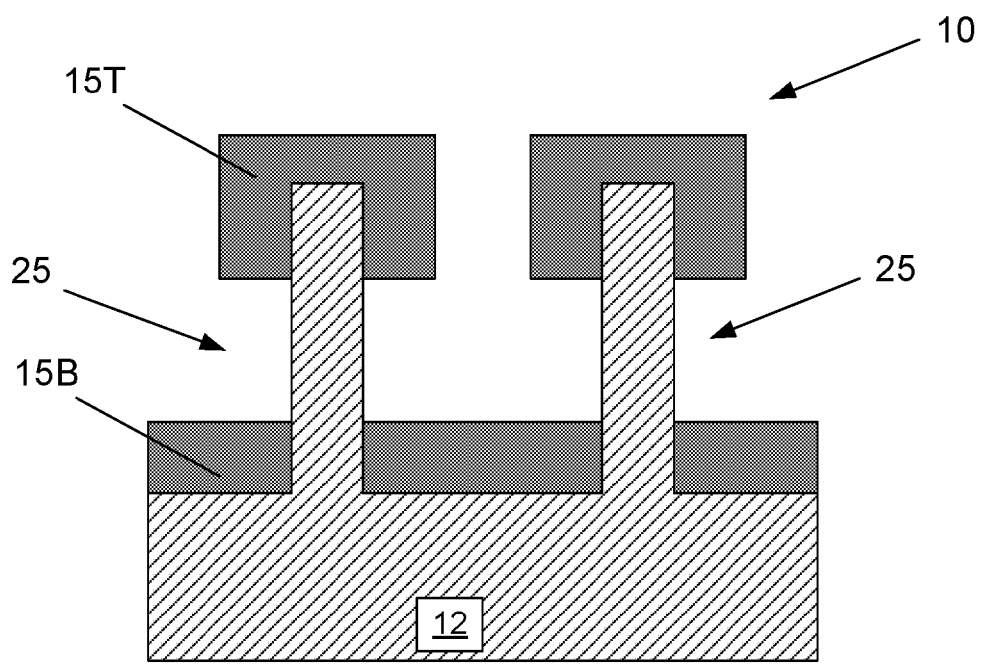
Figure 1E:
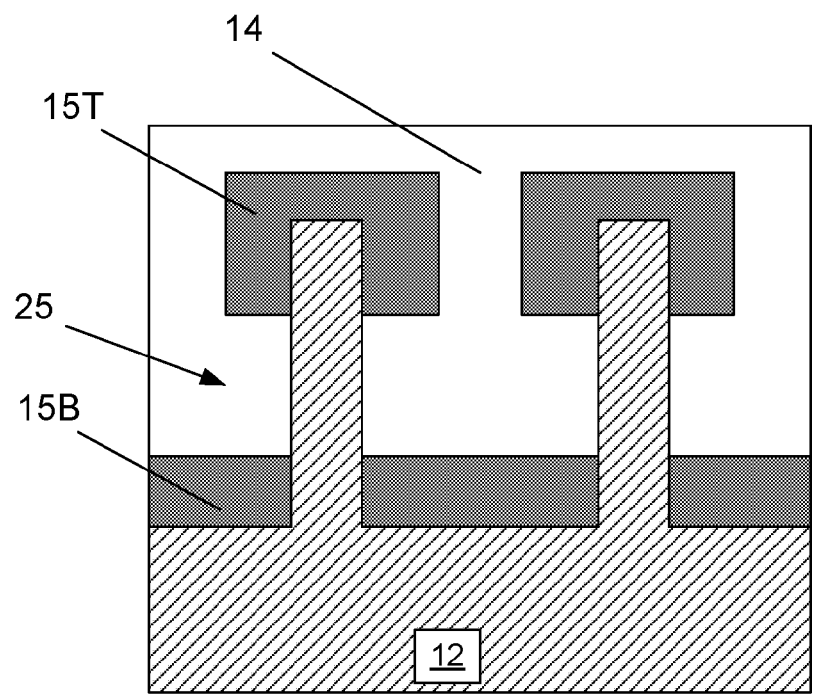
Figure 1F:
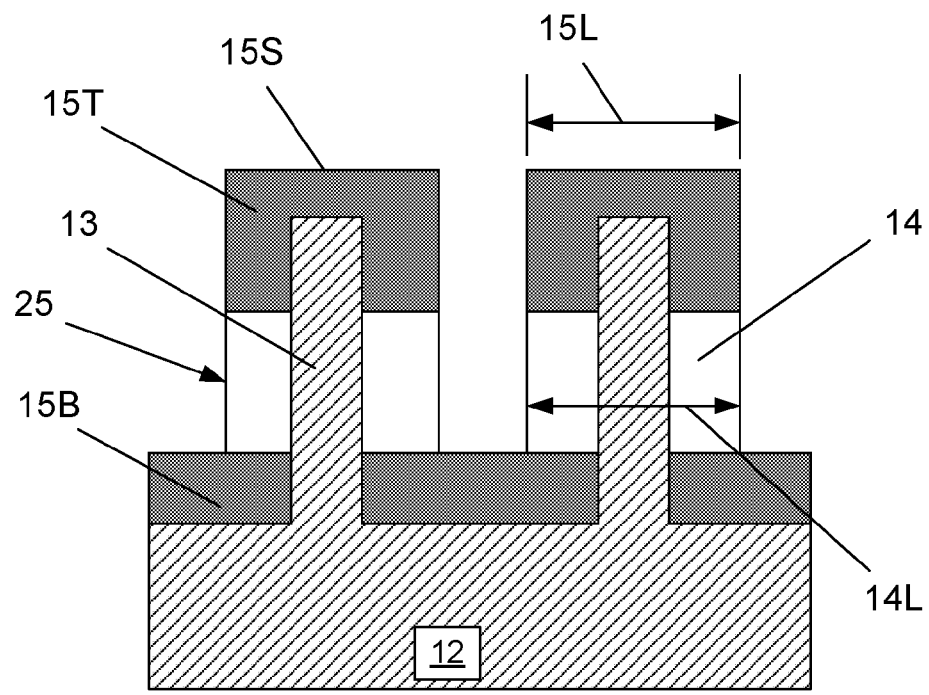

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
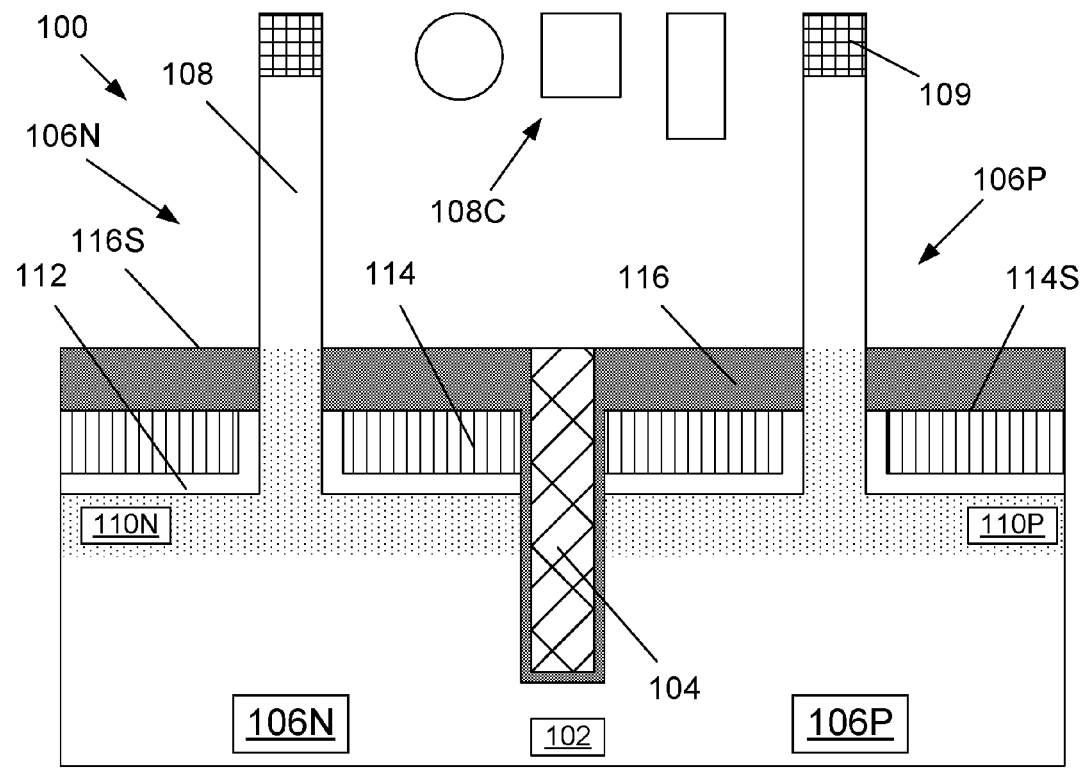
FIGS. 2A-2P depict various illustrative novel methods disclosed herein for forming vertical transistor devices with a self-aligned top source/drain conductive contact.

FIG. 2A depicts one illustrative embodiment of an integrated circuit product 100 disclosed herein at an early stage of fabrication wherein several process operations have already been performed. In general, the product 100 will be formed in and above a substrate 102. The substrate 102 may have a variety of configurations, such as the depicted bulk silicon configuration. The substrate 102 may also have a semiconductor-on-insulator (SOI) or a silicon-on-insulator configuration that includes a bulk silicon layer, a buried insulation layer (silicon dioxide) and an active layer (silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

With continuing reference to FIG. 2A, the product 100 is generally comprised of an N-type vertical transistor device 106N and a P-type vertical transistor device 106P. An illustrative isolation region 104 separates the two devices 106N, 106P. As depicted, a vertically oriented channel semiconductor structure 108 has been formed for each of the devices 106N, 106P. The vertically oriented channel semiconductor structures 108 may have a variety of different configurations 108C when viewed from above, e.g., circular, square, rectangular, etc., as indicated in FIG. 2A. In the depicted example, the vertically oriented channel semiconductor structures 108 are defined by performing one or more etching processes through a patterned etch mask 109. In the illustrative example depicted in the attached figures, the vertically oriented channel semiconductor structures 108 are all of a uniform size and shape. However, such uniformity in the size and shape of the vertically oriented channel semiconductor structures 108 is not required to practice at least some aspects of the inventions disclosed herein. In the example depicted herein, the vertically oriented channel semiconductor structures 108 are depicted as having been formed by performing an anisotropic etching process. In other cases, the vertically oriented channel semiconductor structures 108 may be formed in such a manner that they have a tapered cross-sectional configuration (wider at the bottom than at the top at this point in the process flow). Thus, the size and configuration of the vertically oriented channel semiconductor structures 108 and the manner in which they are made should not be considered a limitation of the present invention.

Also depicted in FIG. 2A are bottom source/drain (S/D) regions 110N, 110P, a conductive liner 112 (e.g., tungsten silicide), a conductive metal layer 114 (e.g., tungsten) and a bottom spacer layer 116 (e.g., silicon nitride). All of the layers of material 112, 114 and 116 are formed around the entire outer perimeter of the vertically oriented channel semiconductor structures 108. The conductive liner 112 and the conductive metal layer 114 collectively constitute a bottom electrode for the devices 106N, 106P that may be used to conductively contact their respective bottom S/D regions 110N, 110P. The bottom S/D region 110N comprises N-type dopant atoms, while the bottom S/D region 110P comprises P-type dopant atoms, and they may be formed by performing one or more ion implantation processes through patterned implant masks (not shown). The implantation processes that are performed to form the bottom S/D regions 110N, 110P may be performed before or after the formation of the vertically oriented channel semiconductor structures 108. The conductive liner 112 may be formed by performing a conformal deposition process and its thickness may vary depending upon the particular application. After the formation of the metal layer 114, a recess etching process may be performed to remove portions of the conductive liner 112 from the sides of the vertically oriented channel semiconductor structures 108 and to recess the conductive metal layer 114 such that it has a recessed upper surface 114S as depicted in FIG. 2A. Thereafter, the bottom spacer layer 116 was deposited and recessed such that it has it has a recessed upper surface 116S as depicted in FIG. 2A.

Figure 2B:
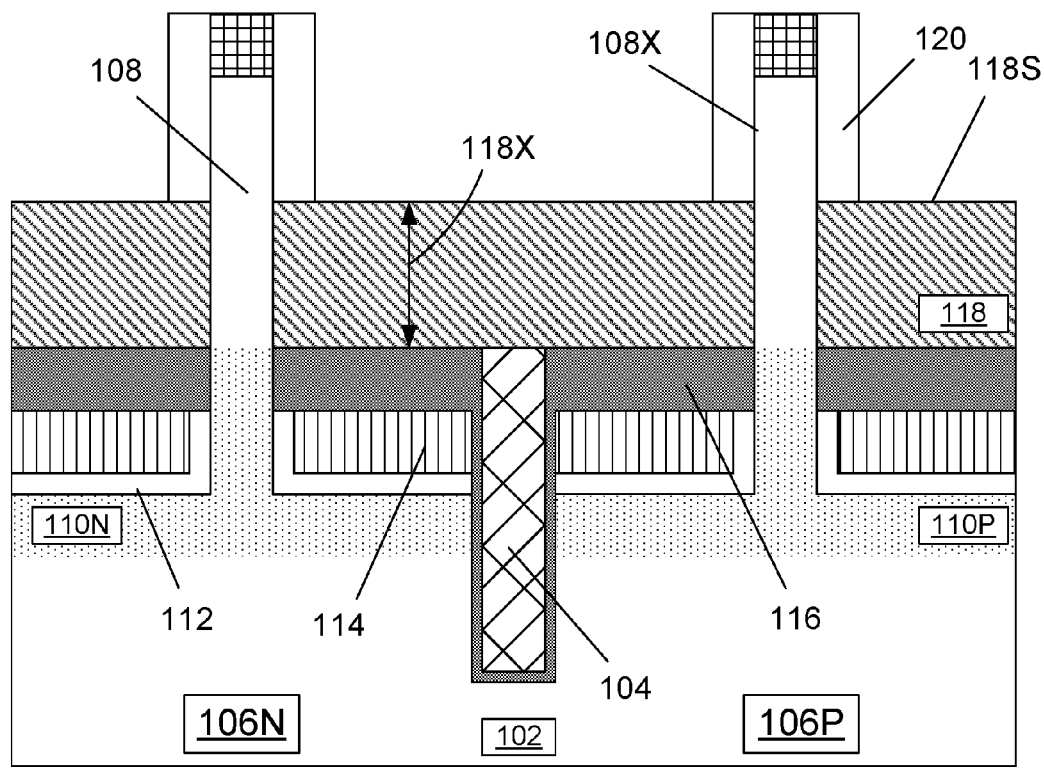

FIG. 2B depicts the product 100 after several process operations were performed. First, a sacrificial layer of material 118 (e.g., silicon dioxide) was formed above the bottom spacer layer 116 and around the entire outer perimeter of the vertically oriented channel semiconductor structures 108. The sacrificial layer of material 118 was formed such that it has a recessed upper surface 118S positioned at the location depicted in FIG. 2B. In some applications, the sacrificial layer of material 118 may be initially deposited and then a recess etching process may be performed on the sacrificial layer of material 118 such that it has the depicted recessed upper surface 118S. However, depending upon the manner in which the sacrificial layer of material 118 was formed, in other applications, the surface 118S may be an as-deposited surface. As will be explained more fully below, the vertical thickness 118X of the sacrificial layer of material 118 will generally correspond to the gate length of the devices 106N, 106P and the vertical height of replacement gate cavities for the devices 106N, 106P.

With continuing reference to FIG. 2B, a sidewall spacer 120 was then formed adjacent each of the vertically oriented channel semiconductor structures 108 above the surface 118S of the sacrificial layer of material 118. In the depicted example, the spacers 120 are formed on and in contact with the outer surface or sidewall 108X (which may have only a single sidewall if the vertically oriented channel semiconductor structures 108 have a generally circular configuration when viewed from above) of the vertically oriented channel semiconductor structures 108. The spacers 120 were formed by depositing a layer of spacer material (e.g., silicon nitride, SiOCN, etc.) and thereafter performing an anisotropic etching process. In one illustrative embodiment, the spacers 120 may have a lateral width at the base of the spacer 120 that falls within the range of about 4-8 nm.

Figure 2C:
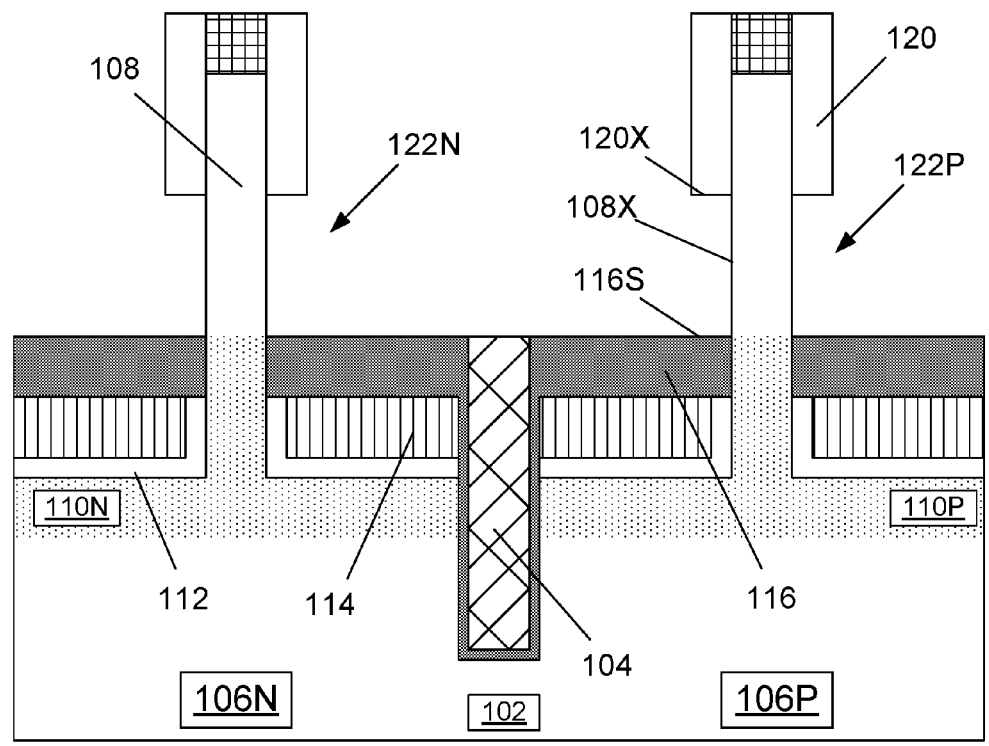

FIG. 2C depicts the product 100 after a wet etching process was performed to remove the sacrificial material layer 118 relative to the surrounding materials. The removal of the sacrificial material layer 118 results in the formation of a replacement gate cavity 122N for the N-type device 106N and a replacement gate cavity 122P for the P-type device 106P. The replacement gate cavities 122N, 122P will generally be referred to by using the reference number 122. As depicted, the replacement gate cavities 122N, 122P is the area between the bottom surface 120X of the sidewall spacer 120 and the surface 116S of the layer of bottom spacer material 116. The replacement gate cavities 122N, 122P expose a portion of the sidewall 108X of the vertically oriented channel semiconductor structures 108.

Figure 2D:
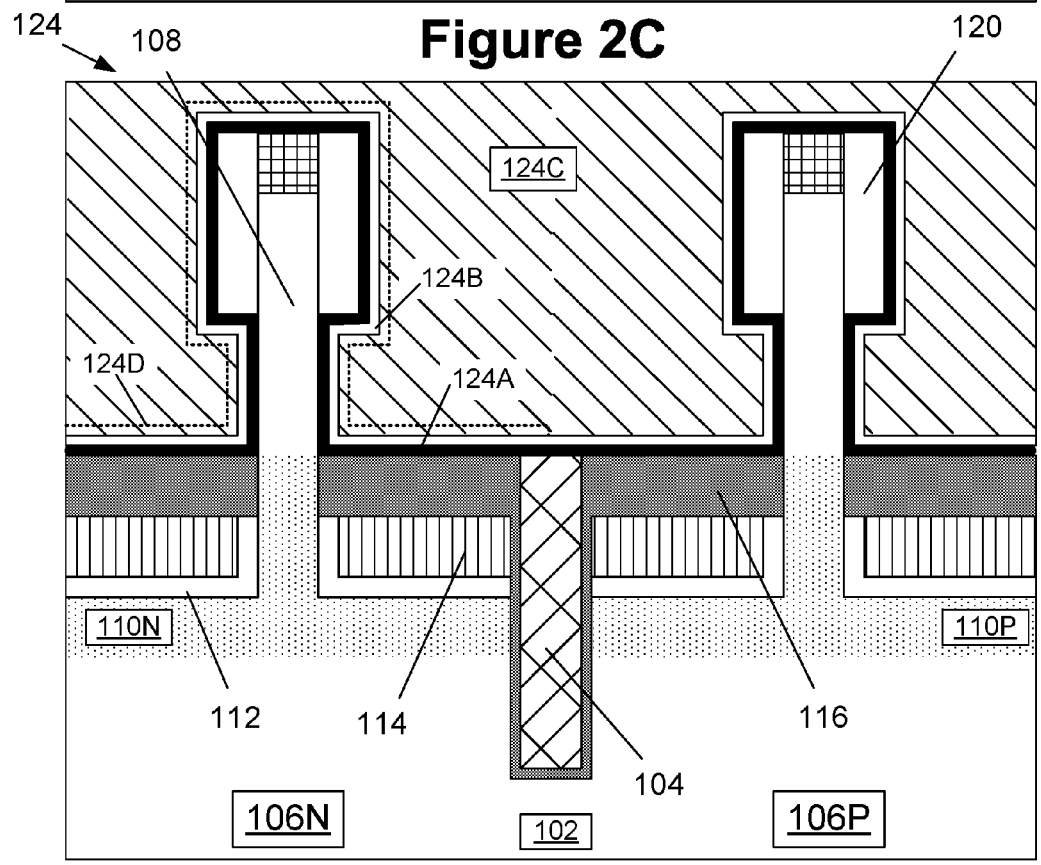

FIG. 2D depicts the product after gate materials 124 for the replacement gate structures for the devices 106N, 106P were formed in the replacement gate cavities 122. In one illustrative example, the same gate materials 124 may be used for the replacement gate structures for both of the devices 106N, 106P. In other applications, by formation of appropriate masking layers (not shown), the gate materials 124 used for the devices 106N, 106P may be different. In the example depicted in FIG. 2D, the gate materials 124 comprise a gate insulation layer 124A, a metal-containing layer 124B and a bulk conductive material layer 124C. In one example, an additional conductive layer 124D (shown as a dashed line) may be formed for the N-type device 106N while the P-type device 106P is masked. The thickness and composition of these materials may vary depending upon the particular application, and the relative thickness of these layers of material shown in the drawings is not to scale.

In one illustrative embodiment, the layer of insulating material 124A may be made of a high-k (k value of 10 or greater) insulating material, such as hafnium oxide, while the metal-containing layer 124B may be made of a material such as titanium nitride. The bulk conductive material layer 124C may be comprised of a material such as tungsten or a doped polysilicon. The layers 124A, 124B (and 124D if present) may be formed by performing a conformal deposition process such as an ALD process.

Figure 2E:
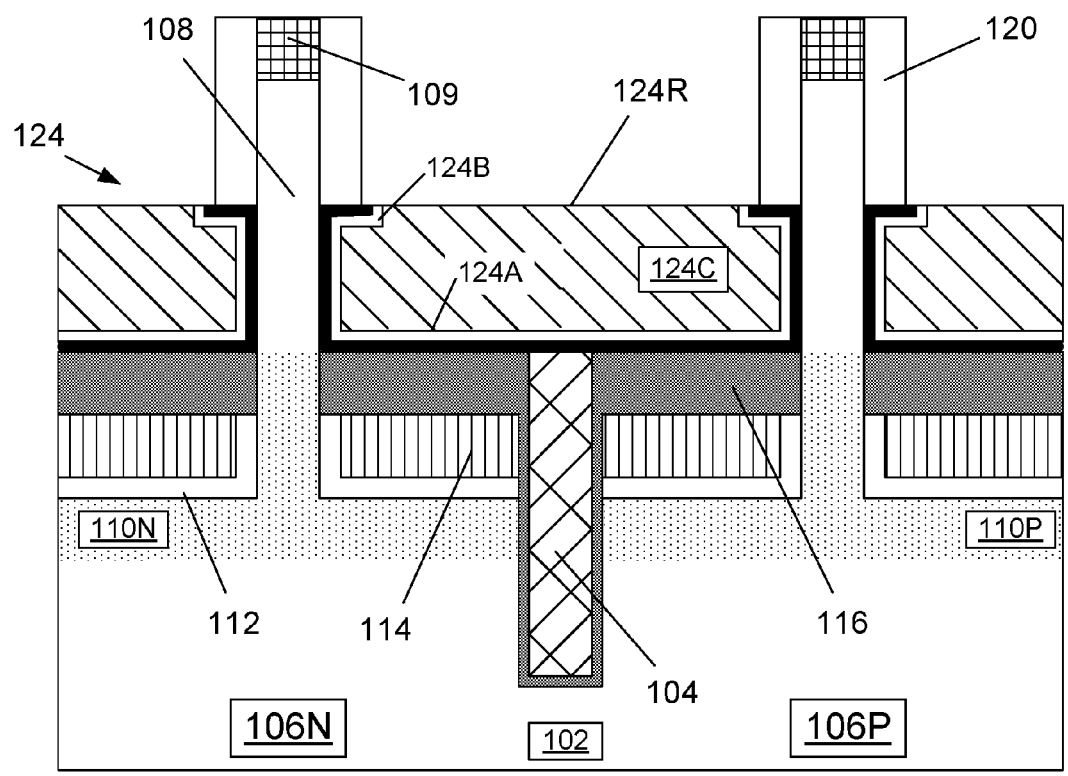

FIG. 2E depicts the product 100 after several process operations were performed to remove portions of the gate materials 124. In one example, one or more etching processes were performed to remove various portions of the gate materials 124 positioned around the spacers 120 and above the mask layer 109 so as to arrive at the structure depicted in the drawing wherein the gate materials 124 (collectively) have a recessed surface 124R. Arriving at the structure depicted in FIG. 2E may involve performing a single etching process with an etchant that can remove all of the materials 124A, 124B and 124C at more or less the same rate. In other applications, to arrive at the structure depicted in FIG. 2E, several etching processes with different etchants may be employed to remove portions of the materials 124A, 124B and/or 124C relative to surrounding materials.

Figure 2F:
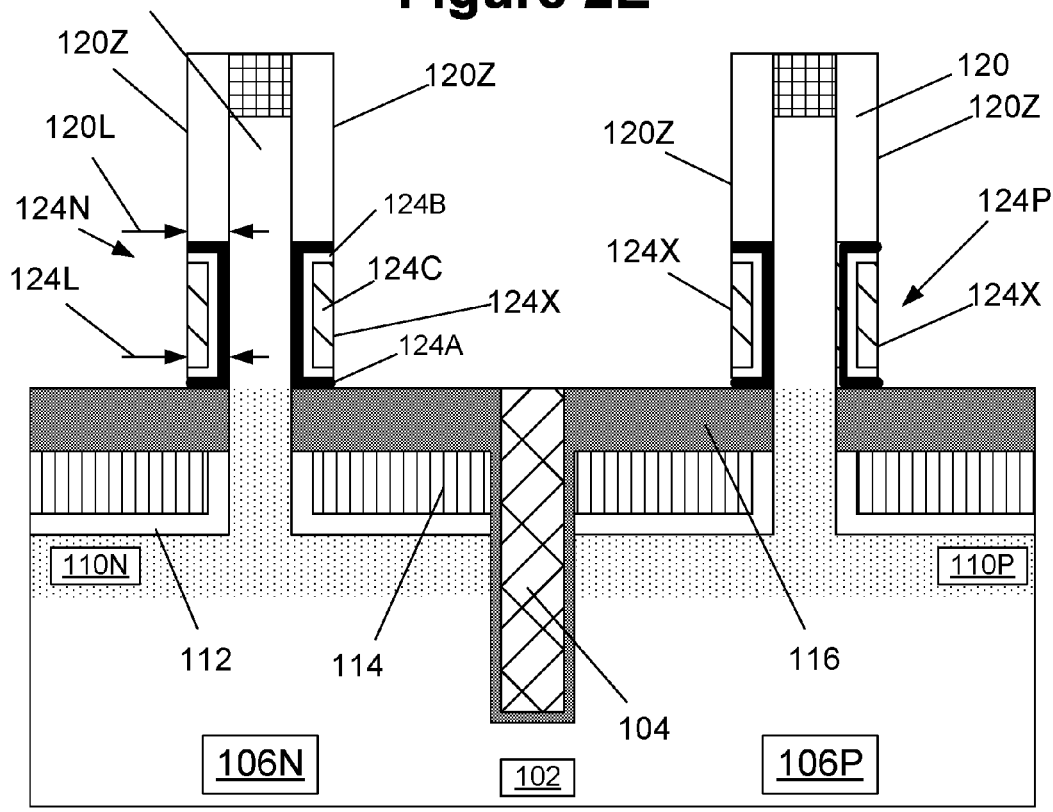

At the point depicted in FIG. 2E, there are at least two options for proceeding with the manufacture of the product 100. As shown in FIG. 2F, one option involves performing an anisotropic etching process that stops on the bottom spacer layer 116 to remove the exposed gate materials 124 that are not protected by the spacers 120. This operation results in the definition of a self-aligned replacement gate structure 124N for the N-type device 106N and a self-aligned gate structure 124P for the P-type device 106P. The gate structures 124N, 124P are self-aligned in the sense that the lateral width 124L of the gate structures 124N, 124P on each side of the vertically oriented channel semiconductor structures 108 is defined by the lateral width 120L of the spacer 120. That is, an outer side surface 124X of each of the replacement gate structures 122N, 122P is substantially vertically aligned with an outer side surface 120Z of its respective sidewall spacer 120.

Figure 2G:
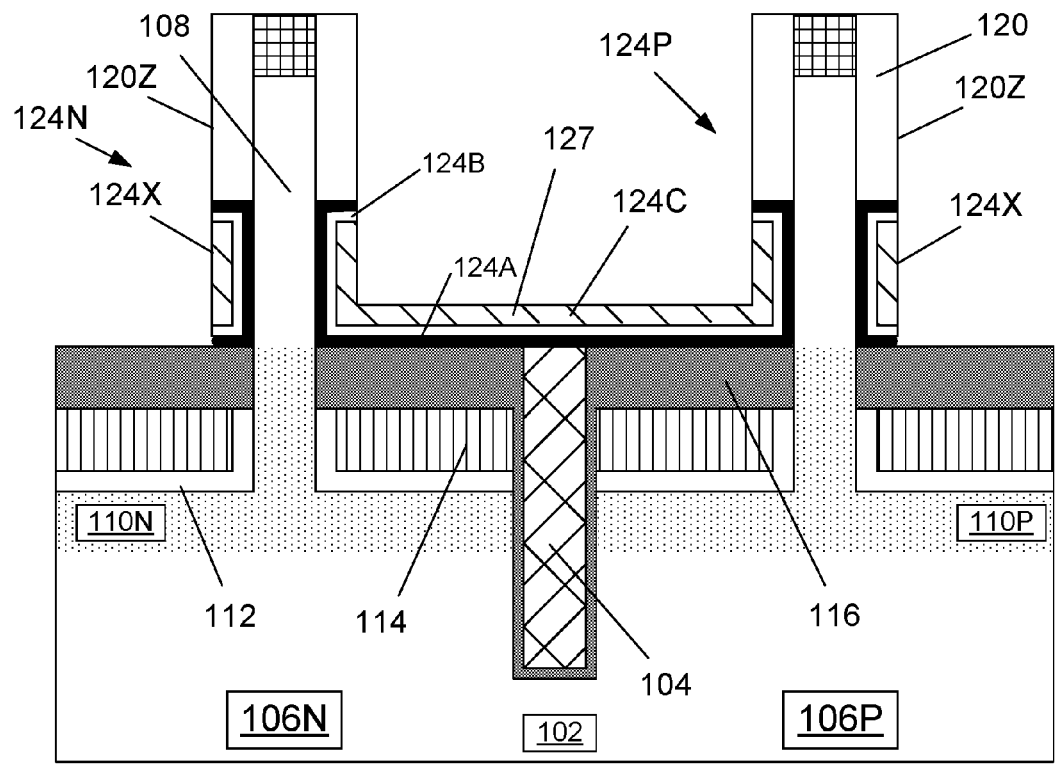

As shown in FIG. 2G, another option involves performing a timed anisotropic etching process within the bulk conductive material layer 124C to remove the exposed gate materials 124 that are not protected by the spacers 120. In this embodiment, the gate structures 124N and 124P are conductively coupled to one another by a local interconnect structure 127 that may be comprised of the layer of conductive material (e.g., 124C and or 124B) that is present in both of the replacement gate structures 122N, 122P. After the formation of the local interconnect structure 127, the local interconnect structure 127 may be masked and the remaining portions of the gate materials 124 not protected by sidewall spacers 120 may be removed. Of course, if desired, the processing could be reversed by use of the appropriate masking layers. Such a product with a local interconnect structure 127 might be beneficial in certain applications, e.g., SRAM products, where such gate structures are sometimes conductively coupled to one another by the formation of separate local interconnect structures. Even with the formation of the local interconnect structure 127, the gate structures 124N, 124P are still considered to be self-aligned gate structures. After a complete reading of the present application, those skilled in the art will appreciate that, when starting with the structure depicted in FIG. 2D (i.e., after the formation of the gate materials 124 so as to overfill the gate cavities 124), one or more etching processes may be performed to arrive at the structure depicted in either FIG. 2F or 2G, wherein the structure depicted in FIG. 2E may simply reflect the product 100 at some point during the process. For ease of reference, subsequent drawings will only depict the embodiment shown in FIG. 2F wherein separate gate structures 124N, 124P were formed.

Figure 2H:
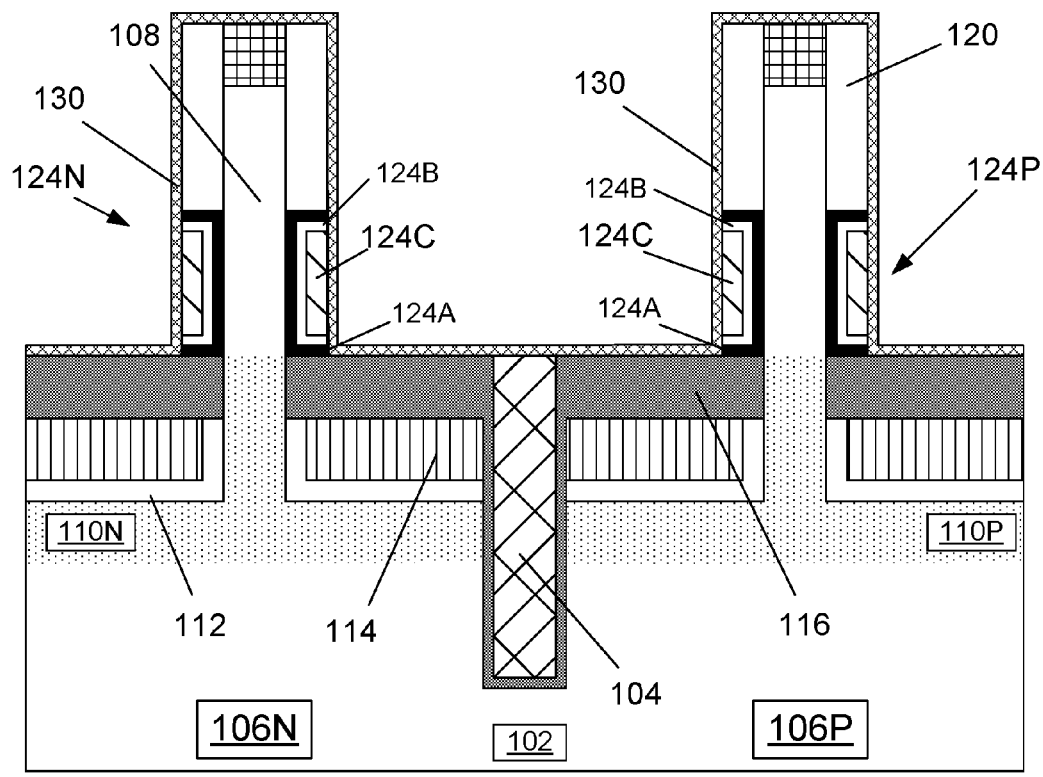

FIG. 2H depicts the product after a non-conductive liner layer 130, e.g., silicon nitride, was formed on the product by performing a conformal deposition process. The thickness of the liner layer 130 may vary depending upon the particular application, e.g., 3-6 nm.

Figure 2I:
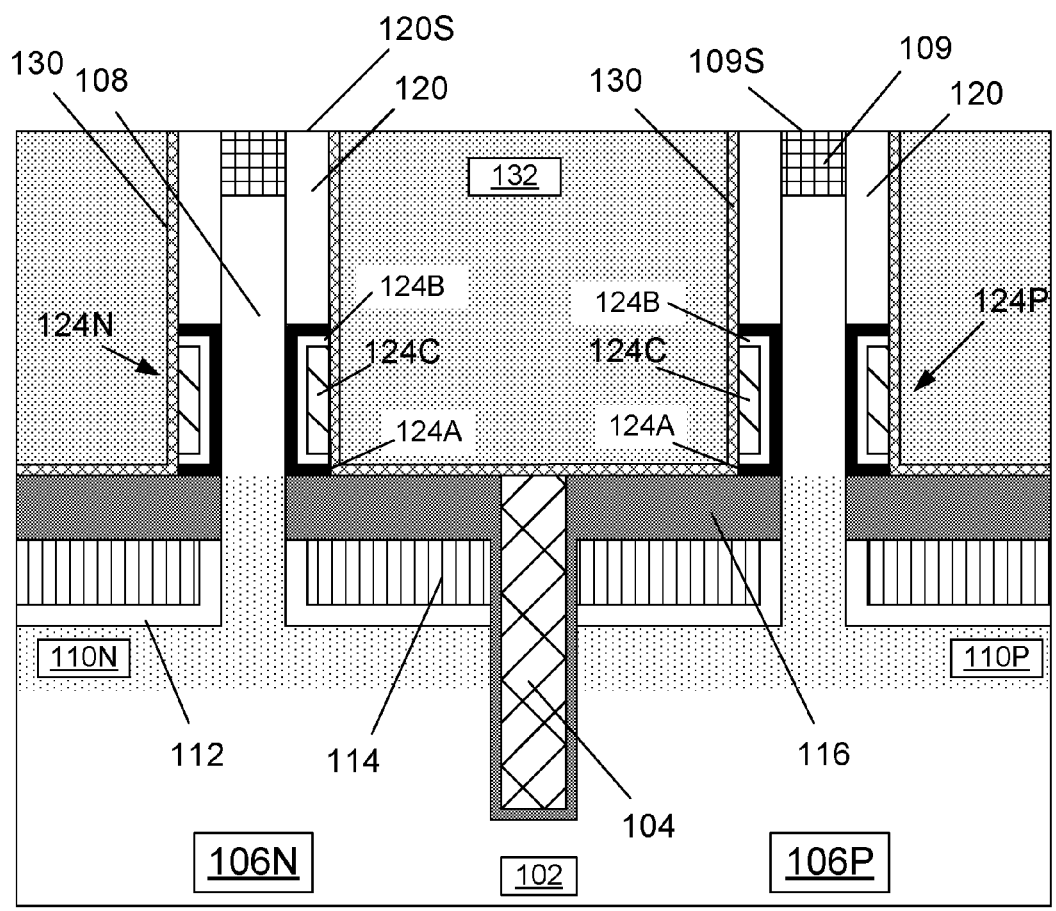

FIG. 2I depicts the product 100 after several process operations were performed. First, a layer of insulating material 132, e.g., a flowable oxide, was formed above the product 100. Thereafter, at least one chemical mechanical polishing (CMP) process was performed to planarize the upper surface of the insulating material 132 with the upper surface 109S of the patterned hard mask layer 109. In effect, the features of the hard mask layer 109 are cap layers or protective layers that protect the underlying vertically oriented channel semiconductor structures 108. This process operation also removes the liner layer 130 from above the upper surface of the spacers 120 and thereby exposes the upper surface 120S of the spacer 120 for further processing.

Figure 2J:
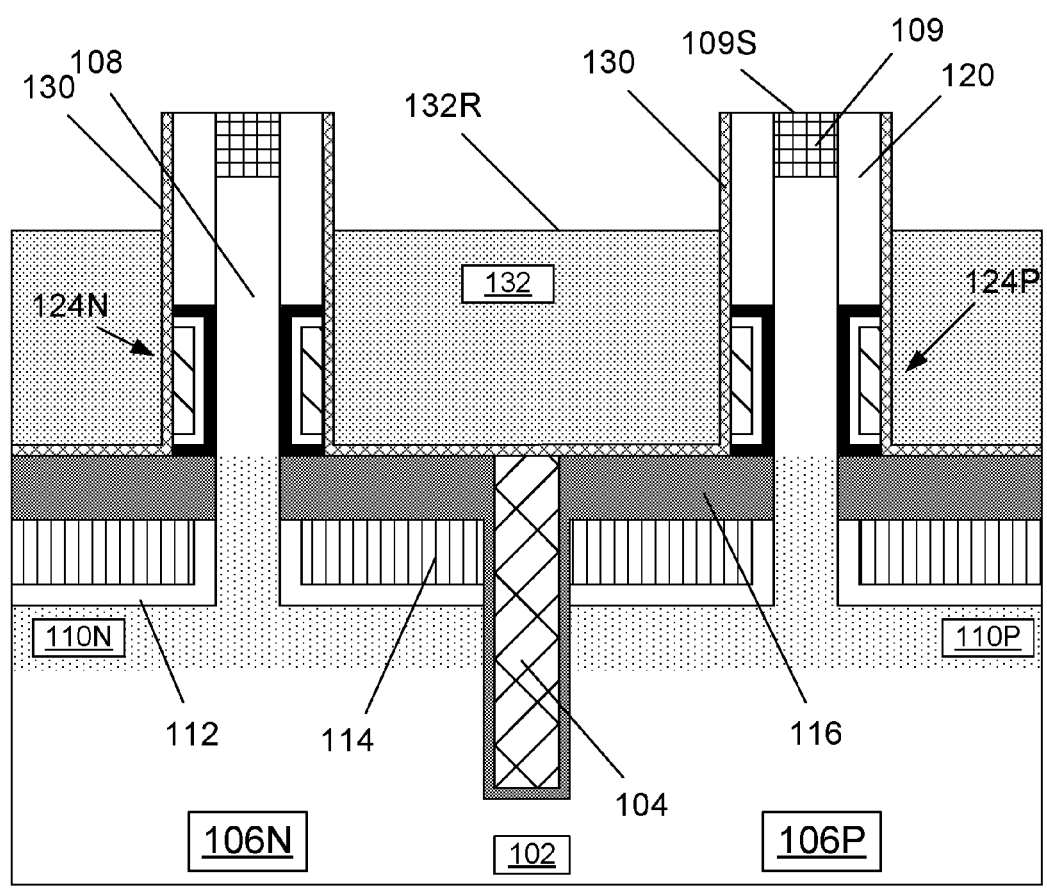

FIG. 2J depicts the product 100 after a timed, recess etching process was performed on the layer of insulating material 132 such that it has a recessed upper surface 132R. The amount or magnitude of the recessing of the layer of insulating material 132 may vary depending upon the particular application, e.g., 25-30 nm.

Figure 2K:
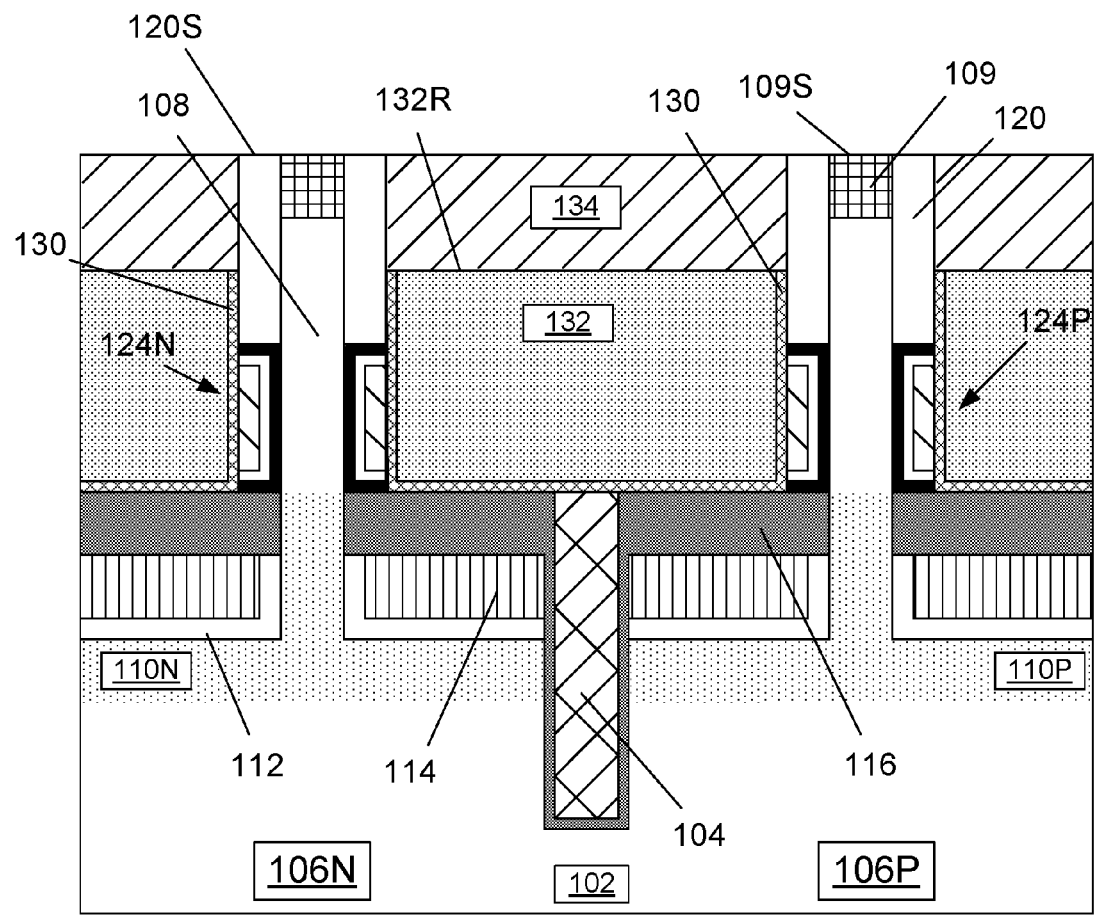

FIG. 2K depicts the product 100 after several process operations were performed. First, the exposed portions of the liner layer 130 positioned above the recessed surface 132R of the layer of insulating material 132 were oxidized. Thereafter, a second layer of insulating material 134, e.g., an HDP oxide, was formed above the product 100. Then, at least one chemical mechanical polishing (CMP) process was performed to planarize the upper surface of the second layer of insulating material 134 with the upper surface 109S of the patterned hard mask layer (cap layer) 109. At the conclusion of this process operation, the upper surface 120S of the spacer 120 and the upper surface 109S of the patterned hard mask layer (cap layer) 109 are exposed for further processing.

Figure 2L:
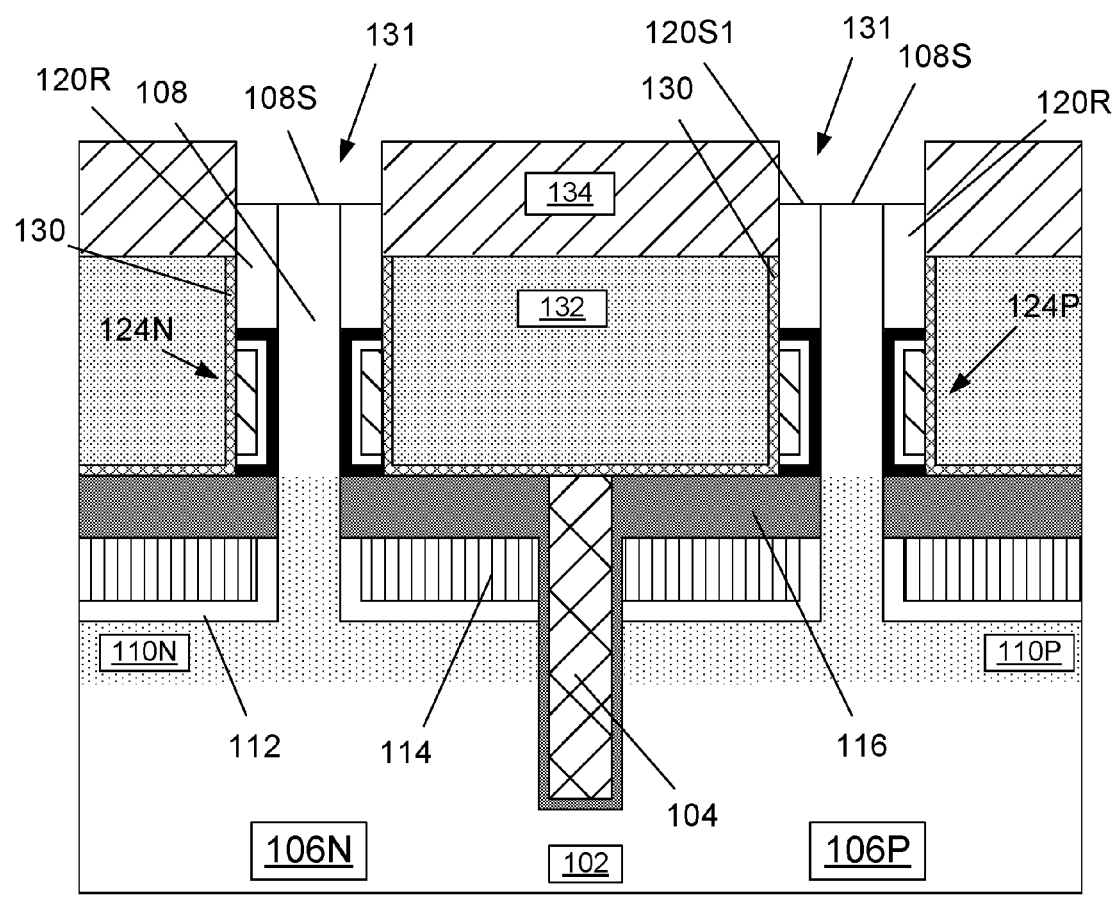

FIG. 2L depicts the product 100 after a timed, recess etching process was performed to remove the entirety of the mask layer (cap layer) 109 and to remove portions of the spacer 120 so as to define recessed spacers 120R. This process operation results in the exposure of an upper surface 108S of the vertically oriented channel semiconductor structures 108. This process operation also results in the definition of a spacer/contact cavity 131 above the upper surface 120S1 of the recessed spacer 120R and the upper surface 108S of the vertically oriented channel semiconductor structure 108 that is surrounded by the insulating material 134.

Figure 2M:
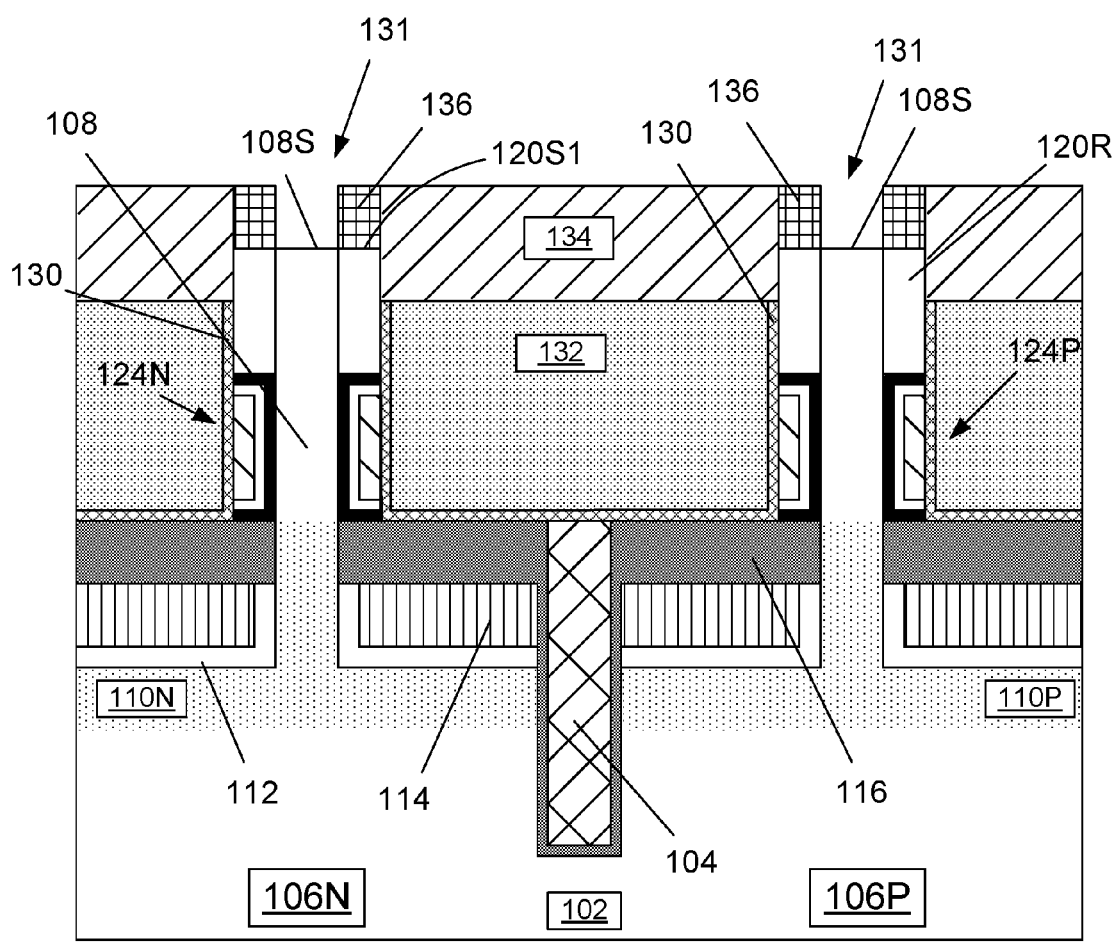

FIG. 2M depicts the product 100 after several process operations were performed. First, a low-k sidewall spacer 136 was formed within the spacer/contact cavity 131 above the recessed spacers 120R while leaving at least a portion of upper surfaces 108S of the vertically oriented channel semiconductor structures 108 exposed for further processing. In some applications, the low-k spacer 136 may be sized such that substantially the entire upper surfaces 108S of the vertically oriented channel semiconductor structures 108 will be exposed for further processing. The low-k sidewall spacers 136 were formed by depositing a layer of spacer material (e.g., an insulating material having a dielectric constant of 5.5 or less, such as SiOCN, SIBCN, etc.) and thereafter performing an anisotropic etching process. In one illustrative embodiment, the low-k sidewall spacer 136 may have a lateral width at the base of the low-k sidewall spacer 136 that is approximately equal to a lateral width of the upper surface 120S1 of the recessed spacer 120R.

Figure 2N:
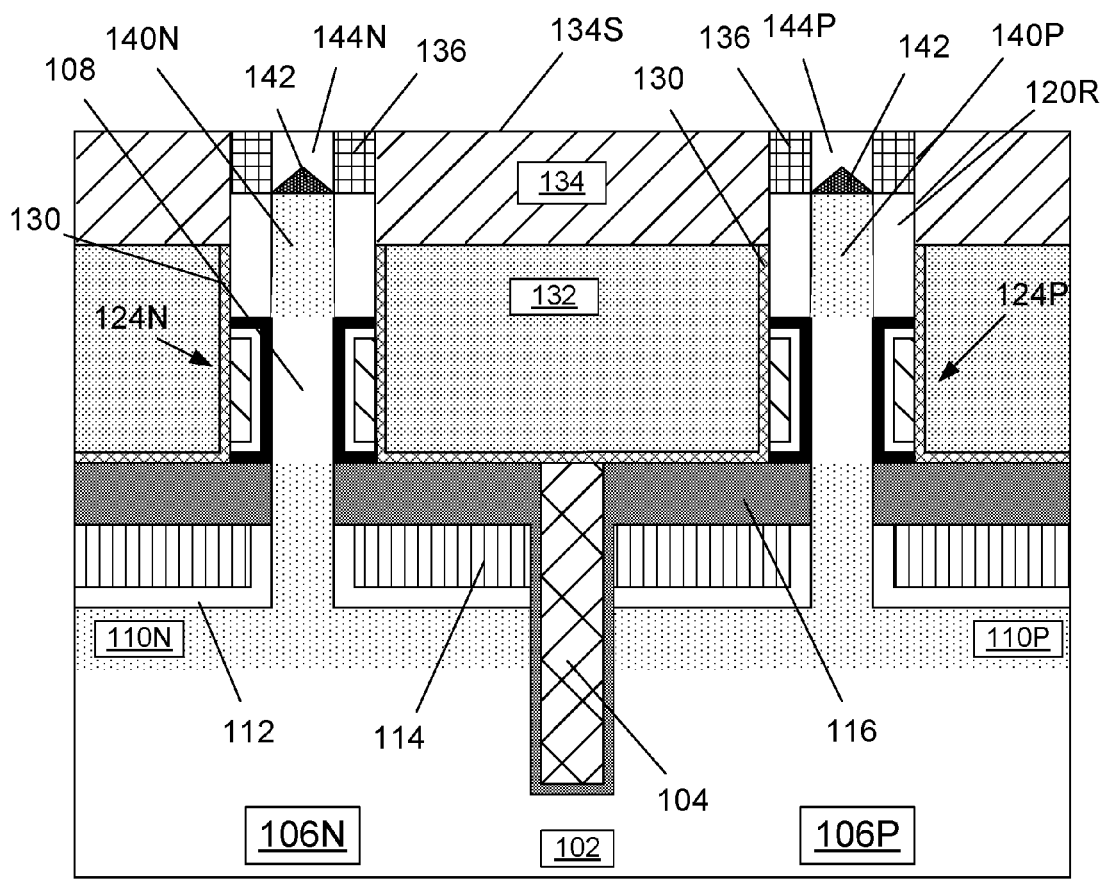

FIG. 2N depicts the product 100 after several process operations were performed. First, a top S/D region 140N (comprises N-type dopant atoms) and a top S/D region 140P (comprises P-type dopant atoms) were formed in the vertically oriented channel semiconductor structures 108 by performing one or more ion implantation processes through patterned implant masks (not shown) and through an opening defined by the low-k sidewall spacer 136. Then, an optional region of epi semiconductor material 142 was formed on the exposed upper surface 108S of the vertically oriented channel semiconductor structures 108 by performing an epitaxial growth process. Next, simplistically depicted self-aligned upper S/D conductive contacts 144N, 144P were formed in the spacer/contact cavities 131 for the devices 106N, 106P, respectively. The self-aligned upper S/D conductive contacts 144N, 144P are conductively coupled to the top S/D regions 140N, 140P, respectively. Note that the self-aligned upper S/D conductive contacts 144N, 144P are self-aligned in that their configuration is defined by the remaining unfilled portion of the spacer/contact cavities 131 at the time the upper S/D conductive contacts 144N, 144P are formed. Also note that, in one embodiment, the self-aligned upper S/D contacts 144N, 144P physically contact the low-k spacer 136 within its associated spacer/contact cavity 131. The upper S/D contacts 144N, 144P were formed by depositing an appropriate contact metal, such as tungsten, so as to overfill the spacer/contact cavity 131 above the epi semiconductor materials 142 (in the depicted example) and thereafter performing a CMP process to remove excess materials positioned above the upper surface 134S of the layer of insulating material 134. Additionally, although not separately depicted, a metal silicide layer (not shown) may be formed on the epi semiconductor materials 142 prior to depositing the contact metal.

Figure 2O:
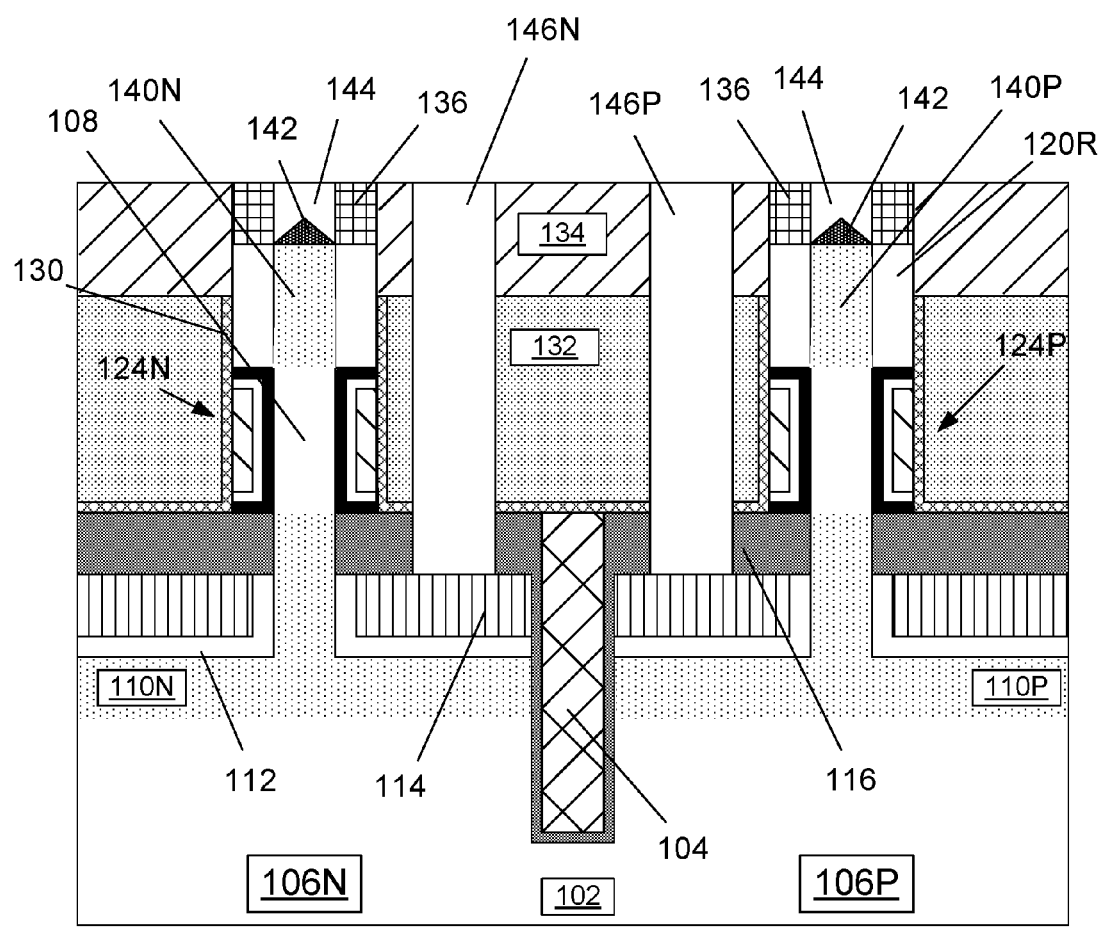

FIG. 2O depicts the product 100 after simplistically depicted lower S/D contacts 146N, 146P were formed for the devices 106N, 106P, respectively. The lower S/D contacts 146N, 146P are conductively coupled to the bottom S/D regions 110N, 110P via the conductive metal layer 114 and the conductive liner layer 112. The lower S/D contacts 146N, 146P are intended to be representative of any type of conductive structure that may be formed on a semiconductor device using any of a variety of different types of materials, and they may include one or more liner layers or barrier layers (not depicted). In general, the lower S/D contacts 146N, 146P may be formed by forming a contact opening in the various layers of material that exposes the conductive metal layer 114, filling the contact opening with the appropriate materials and thereafter performing a CMP process to remove excess materials positioned above the upper surface of the layer of insulating material 134. The separate contacts for the gate structures 124N, 124P may be formed at the same time as are the lower S/D contacts 146N, 146P. However, in this example, the contact structures are not depicted in the cross-sectional drawing shown in FIG. 2O as the gate contacts will be formed at a location of the product that is not include in FIG. 2O, e.g., behind the vertically oriented channel semiconductor structures 108.

Figure 2P:
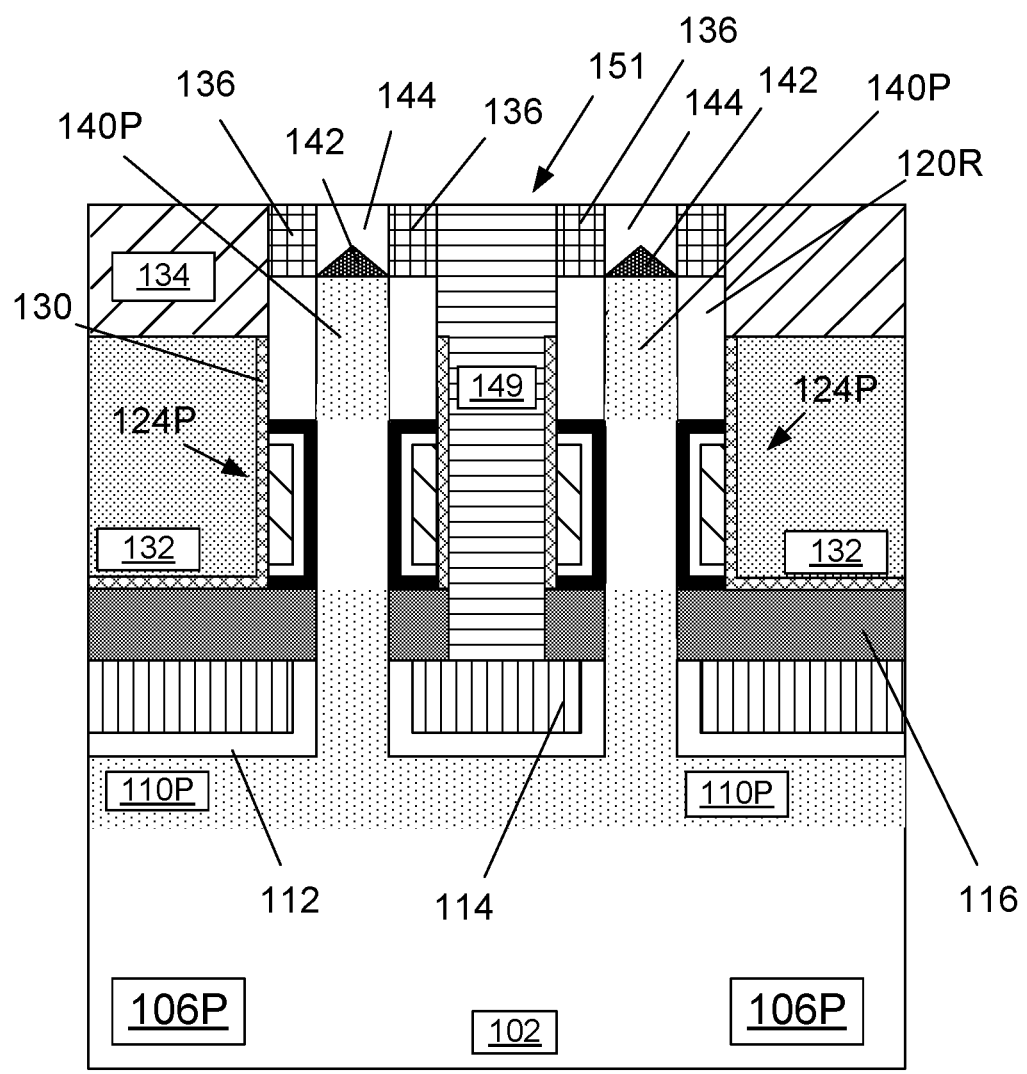

Of course, as will be appreciated by those skilled in the art after a complete reading of the present application, the novel methods and structures disclosed herein may be employed in advanced device technologies such as those requiring the use of self-aligned contacts. FIG. 2P depicts an illustrative example of an integrated circuit produce 100 wherein two transistors of the same type, P-type transistors in the depicted example, are formed side-by-side in the substrate 102 and an illustrative and simplistically depicted self-aligned contact 149 is formed to establish electrical contact to the shared bottom S/D regions 110P of the devices. Of course, the methods disclosed herein may be employed when devices of opposite types are configured so as to have a shared bottom S/D region. In the depicted example, with a masking layer in position that exposes a portion of the region 151 in between the two gate structures 124P, an etching process is performed to remove the silicon dioxide materials 134 and 132 relative to the spacers 136, the recessed spacers 120R and the liner layer 130. The removal of the silicon dioxide materials stops on the liner layer 130. At that point, the etch chemistry may be changed to punch through the liner layer 130 and etch through the bottom spacer layer 116 so as to expose a portion of the conductive metal layer 114. At that point, after the conductive metal layer is exposed, the materials for the self-aligned contact 149, including any barrier layers or liner layers (not separately shown), are formed in the opening for the self-aligned contact 149. The simplistically depicted self-aligned contact 149 is intended to be representative of any type of self-aligned contact structure that may be formed on a semiconductor device and it may be formed using any of a variety of different types of materials. In general, the self-aligned contact 149 may be formed by forming the above-described contact opening in the various layers of material that exposes the conductive metal layer 114, filling the contact opening with the appropriate materials and thereafter performing a CMP process to remove excess materials positioned above the upper surface of the layer of insulating material 134.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
   forming a vertically oriented channel semiconductor structure with a cap layer positioned above said vertically oriented channel semiconductor structure;
   forming a first sidewall spacer adjacent said vertically oriented channel semiconductor structure and adjacent said cap layer;
   forming a layer of insulating material adjacent said first sidewall spacer;
   performing at least one planarization process so as to planarize an upper surface of said layer of insulating material and expose an upper surface of said cap layer and an upper surface of said first sidewall spacer;
   performing at least one etching process to remove a portion of said first sidewall spacer and to remove an entirety of said cap layer so as to thereby expose an upper surface of said vertically oriented channel semiconductor structure and define a spacer/contact cavity above said vertically oriented channel semiconductor structure and said first sidewall spacer;
   forming a second spacer in said spacer/contact cavity, wherein after formation of said second spacer, at least a portion of said upper surface of said vertically oriented channel semiconductor structure remains exposed;
   after forming said second spacer, forming a top source/drain region in said vertically oriented channel semiconductor structure; and
   forming a top source/drain contact within said spacer/contact cavity that is conductively coupled to said top source/drain region, wherein said conductive contact physically contacts said second spacer in said spacer/contact cavity.

2. The method of claim 1, wherein said first sidewall spacer is formed on and in contact with a sidewall of said vertically oriented channel semiconductor structure and on and in contact with a sidewall of said cap layer.

3. The method of claim 1, wherein said second sidewall spacer comprises a low-k insulating material.

4. The method of claim 3, wherein the cap layer comprises silicon nitride and the first sidewall spacer comprises SiOCN.

5. The method of claim 1, wherein, after forming said top source/drain region and prior to forming said top source/drain contact, the method comprises forming an epi semiconductor material on said exposed upper surface of said vertically oriented channel semiconductor structure.

6. The method of claim 1, wherein forming said second spacer in said spacer/contact cavity comprises depositing a layer of material for said second spacer in said spacer/contact cavity and performing an anisotropic etching process on said layer of material for said second spacer.

7. The method of claim 1, wherein forming said second spacer in said spacer/contact cavity comprises forming said second spacer in said spacer/contact cavity such that, after the formation of said second spacer, the entire upper surface of said vertically oriented channel semiconductor structure remains exposed.

8. The method of claim 1, wherein forming said top source/drain region comprises performing an ion implantation process through an opening defined by said second spacer.

9. The method of claim 1, wherein:
   prior to forming said first sidewall spacer, the method comprises:
      forming a layer of a bottom spacer material around said vertically oriented channel semiconductor structure; and
      forming a sacrificial material layer on and in contact with an upper surface of said layer of said bottom spacer material, said sacrificial material layer having an upper surface, wherein said first sidewall spacer is formed such that a bottom surface of said first sidewall spacer contacts said upper surface of said sacrificial material layer; and
   after forming said first sidewall spacer and prior to forming said layer of insulating material adjacent said first sidewall spacer, the method further comprises:
      removing said sacrificial material layer so as to define a replacement gate cavity between a bottom surface of said first sidewall spacer and said layer of said bottom spacer material; and
      forming a replacement gate structure in said replacement gate cavity.

10. The method of claim 9, wherein an outer surface of said replacement gate structure is substantially vertically aligned with an outer side surface of said first sidewall spacer.

11. A method of forming a vertical transistor device, the method comprising:
   forming a vertically oriented channel semiconductor structure with a cap layer positioned above said vertically oriented channel semiconductor structure;
   forming a first sidewall spacer on and in contact with a sidewall of said vertically oriented channel semiconductor structure and on and in contact with a sidewall of said cap layer;
   forming a layer of insulating material adjacent said first sidewall spacer;
   performing at least one planarization process so as to planarize an upper surface of said layer of insulating material and expose an upper surface of said cap layer and an upper surface of said first sidewall spacer;
   performing at least one etching process to remove a portion of said first sidewall spacer and to remove an entirety of said cap layer so as to thereby expose an upper surface of said vertically oriented channel semiconductor structure and define a spacer/contact cavity above said vertically oriented channel semiconductor structure and said first sidewall spacer;
   forming a second spacer comprised of a low-k material in said spacer/contact cavity, wherein after formation of said second spacer, substantially the entire upper surface of said vertically oriented channel semiconductor structure remains exposed;
   after forming said second spacer, forming a top source/drain region in said vertically oriented channel semiconductor structure by performing an ion implantation process through an opening defined by said second spacer; and
   forming a top source/drain contact within said spacer/contact cavity that is conductively coupled to said top source/drain region, wherein said conductive contact physically contacts said second spacer in said spacer/contact cavity.

12. The method of claim 11, wherein said cap layer comprises silicon nitride and said first sidewall spacer comprises SiOCN.

13. The method of claim 11 wherein, after forming said top source/drain region and prior to forming said top source/drain contact, the method comprises forming an epi semiconductor material on said exposed upper surface of said vertically oriented channel semiconductor structure.

14. The method of claim 11, wherein forming said second spacer in said spacer/contact cavity comprises depositing a layer of material for said second spacer in said spacer/contact cavity and performing an anisotropic etching process on said layer of material for said second spacer.

15. The method of claim 11 wherein:

prior to forming said first sidewall spacer, the method comprises:

forming a layer of a bottom spacer material around said vertically oriented channel semiconductor structure; and forming a sacrificial material layer on and in contact with an upper surface of said layer of said bottom spacer material, said sacrificial material layer having an upper surface, wherein said first sidewall spacer is formed such that a bottom surface of said first sidewall spacer contacts said upper surface of said sacrificial material layer; and after forming said first sidewall spacer and prior to forming said layer of insulating material adjacent said first sidewall spacer, the method further comprises:

removing said sacrificial material layer so as to define a replacement gate cavity between a bottom surface of said first sidewall spacer and said layer of said bottom spacer material; and forming a replacement gate structure in said replacement gate cavity.

16. The method of claim 15, wherein an outer surface of said replacement gate structure is substantially vertically aligned with an outer side surface of said first sidewall spacer.

* * * * *